United States Patent
Chu et al.

(10) Patent No.: US 10,153,265 B1
(45) Date of Patent: Dec. 11, 2018

(54) DUMMY CELL ARRANGEMENT AND METHOD OF ARRANGING DUMMY CELLS

(71) Applicant: UNITED MICROELECTRONICS CORP., Hsin-Chu (TW)

(72) Inventors: Chung-Liang Chu, Kaohsiung (TW); Yu-Ruei Chen, New Taipei (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/681,439

(22) Filed: Aug. 21, 2017

(51) Int. Cl.
  *H01L 27/02* (2006.01)
  *H01L 27/088* (2006.01)
  *H01L 21/8234* (2006.01)

(52) U.S. Cl.
  CPC .. *H01L 27/0207* (2013.01); *H01L 21/823431* (2013.01); *H01L 21/823475* (2013.01); *H01L 27/0886* (2013.01)

(58) Field of Classification Search
  CPC ......... H01L 27/0207; H01L 21/823475; H01L 27/0886; H01L 21/823431
  See application file for complete search history.

(56) References Cited

U.S. PATENT DOCUMENTS

| | | | | |
|---|---|---|---|---|
| 2002/0061608 A1* | 5/2002 | Kuroda | ............ | H01L 21/31053 438/129 |
| 2007/0221957 A1* | 9/2007 | Kitajima | ............ | H01L 27/0207 257/202 |
| 2008/0315365 A1* | 12/2008 | Takada | ................ | H01L 21/3212 257/618 |
| 2009/0055794 A1* | 2/2009 | Kimoto | ............... | G06F 17/5068 716/55 |
| 2009/0057781 A1* | 3/2009 | Anderson | ....... | H01L 21/823431 257/401 |
| 2011/0004859 A1 | 1/2011 | Summerfelt | | |
| 2011/0095374 A1* | 4/2011 | Kawahara | ........... | G06F 17/5068 257/368 |
| 2011/0278679 A1* | 11/2011 | Tabata | ..................... | G03F 1/36 257/390 |
| 2012/0187500 A1* | 7/2012 | Shinkawata | .... | H01L 21/823857 257/369 |

(Continued)

OTHER PUBLICATIONS

Chang, Title of Invention: Dummy Pattern Arrangement and Method of Arranging Dummy Patterns , U.S. Appl. No. 15/183,800, filed Jun. 16, 2016.

*Primary Examiner* — Bitew A Dinke
(74) *Attorney, Agent, or Firm* — Winston Hsu

(57) ABSTRACT

A dummy cell arrangement in a semiconductor device includes a substrate with a dummy region, unit dummy cells arranged in rows and columns in the dummy region, and flexible extended dummy cells arranged in rows and columns filling up remaining dummy region. The unit dummy cell includes exactly one base dummy cell and exactly two fixed dummy cells at opposite sides of the base dummy cell in row direction or in column direction and the flexible extended dummy cell includes at least two base dummy units and a plurality of flexible dummy units at two opposite sides of the two base dummy units in row direction or in column direction. The base dummy cell consists of at least one fin, at least one gate and at least one contact, while the flexible dummy cell consists of one gate and one contact without any fin.

4 Claims, 7 Drawing Sheets

(56) References Cited

U.S. PATENT DOCUMENTS

| | | | |
|---|---|---|---|
| 2013/0062707 A1* | 3/2013 | Lien | H01L 27/0207 257/401 |
| 2013/0105913 A1* | 5/2013 | Hirotsu | H01L 27/088 257/401 |
| 2013/0228866 A1* | 9/2013 | Lee | H01L 21/823431 257/355 |
| 2013/0277760 A1* | 10/2013 | Lu | H01L 29/10 257/401 |
| 2014/0189625 A1* | 7/2014 | Huang | G06F 17/5068 716/111 |
| 2015/0278420 A1* | 10/2015 | Ke | G06F 17/5072 716/124 |
| 2015/0287746 A1* | 10/2015 | Shinkawata | H01L 27/1207 257/347 |
| 2015/0364549 A1* | 12/2015 | Lee | H01L 29/0653 257/77 |
| 2017/0365675 A1* | 12/2017 | Chang | H01L 29/4238 |
| 2018/0004882 A1* | 1/2018 | Hsieh | G06F 17/5072 |

* cited by examiner

DUMMY CELL ARRANGEMENT AND METHOD OF ARRANGING DUMMY CELLS

BACKGROUND OF THE INVENTION

1. Field of the Invention

The present invention relates to a dummy cell arrangement and a method of arranging dummy cells, and more specifically, a selective and extended dummy cells arrangement with flexible dummy cells.

2. Description of the Prior Art

The integrated circuit (IC) design is more challenging when semiconductor technologies are continually progressing to smaller feature sizes, such as 45 nanometers, 28 nanometers, and below. The performance of a chip design is seriously influenced by the control of resistance/capacitance (RC), timing, leakage, and topology of the metal/dielectric inter-layers. Those are further related to resolution of the lithography patterning and the imaging accuracy.

To enhance the imaging effect when a design pattern is transferred to a wafer, an optical proximity correction (OPC) to minimize the proximity effect is indispensable. Assist features are added to an IC pattern to improve the imaging resolution of the IC pattern during a lithography patterning process.

In another aspect, during the semiconductor fabrication, a chemical mechanical polishing (CMP) process is applied to the wafer for polishing back and globally planarizing the wafer surface. CMP involves both mechanical grinding and chemical etching in the material removal process. However, because the removal rates of different materials (such as metal and dielectric material) are usually different, polishing selectivity leads to undesirable dishing and erosion effects. The dishing issue occurs when the copper recedes below or protrudes above the level of the adjacent dielectric. Erosion is a localized thinning of the dielectric. In this case, dummy features are inserted into the IC pattern to enhance the CMP performance.

However, along with the progress of semiconductor technology, the feature sizes are getting smaller and smaller. The existing methods to add various dummy features have limited degree of freedom and effectiveness to tune the pattern density and poor uniformity of the pattern density. In current filling scheme, there are always large dummy areas remaining near the area boundary after regular dummy cells are filled in. This issue is more aggravated when the dummy region is in irregular shape. Incomplete dummy cell filling would present even more issues, such as spatial charging effect and micro-loading effect, when an electron-beam lithography technology is used to form the IC pattern. Furthermore, during the process to insert dummy features, various simulations and calculations associated with the dummy features take more time, causing the cost to increase. Therefore, a more flexible and effective method to fill up the dummy region is needed to address the above issues.

SUMMARY OF THE INVENTION

The following paragraphs present a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

It is a novel concept to provide a flexible dummy cell relatively smaller than regular dummy cells and free of the limitation by the rule that the base unit cell should have the minimum pitch in both row and column direction. The flexible dummy cell can fill up the remaining dummy regions that regular dummy cells cannot, even the irregular dummy regions.

In one aspect of the embodiments, there is provided a dummy cell arrangement in a semiconductor device. The dummy cell arrangement includes a substrate with a dummy region, unit dummy cells arranged in rows and columns in the dummy region, wherein each unit dummy cell consists of exactly one base dummy unit and exactly two fixed dummy units at two opposite sides of the base dummy unit in row direction or in column direction, and the base dummy unit consists of at least one fin, at least one gate traversing at least one fin and at least one contact on said at least one fin, and flexible extended dummy cells arranged at the end of the unit dummy cells in rows and columns and filling up remaining dummy region, wherein each flexible extended dummy cell consists of at least two base dummy units and a plurality of flexible dummy units at two opposite sides of the base dummy units in a row direction or in a column direction, and the flexible dummy unit includes one gate and one contact without any fin.

In another aspect of the embodiments, there is provided a method of arranging dummy cells in a semiconductor device. The method includes the steps of defining a dummy region on a substrate, filling up the dummy region with unit dummy cells arranged in rows and columns, wherein the unit dummy cell consists of exactly one base dummy unit and exactly two fixed dummy units at two opposite sides of the base dummy unit in row direction or in column direction, and the base dummy unit consists of at least one fin, at least one gate traversing the fin and at least one contact on the fin, and filling up remaining dummy region with flexible extended dummy cells arranged at the end of unit dummy cells in rows and columns, wherein each flexible extended dummy cell consists of at least two base dummy units and a plurality of flexible dummy units at two opposite sides of the base dummy units in a row direction or in a column direction, and the flexible dummy unit consists of one gate and one contact without any fin.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
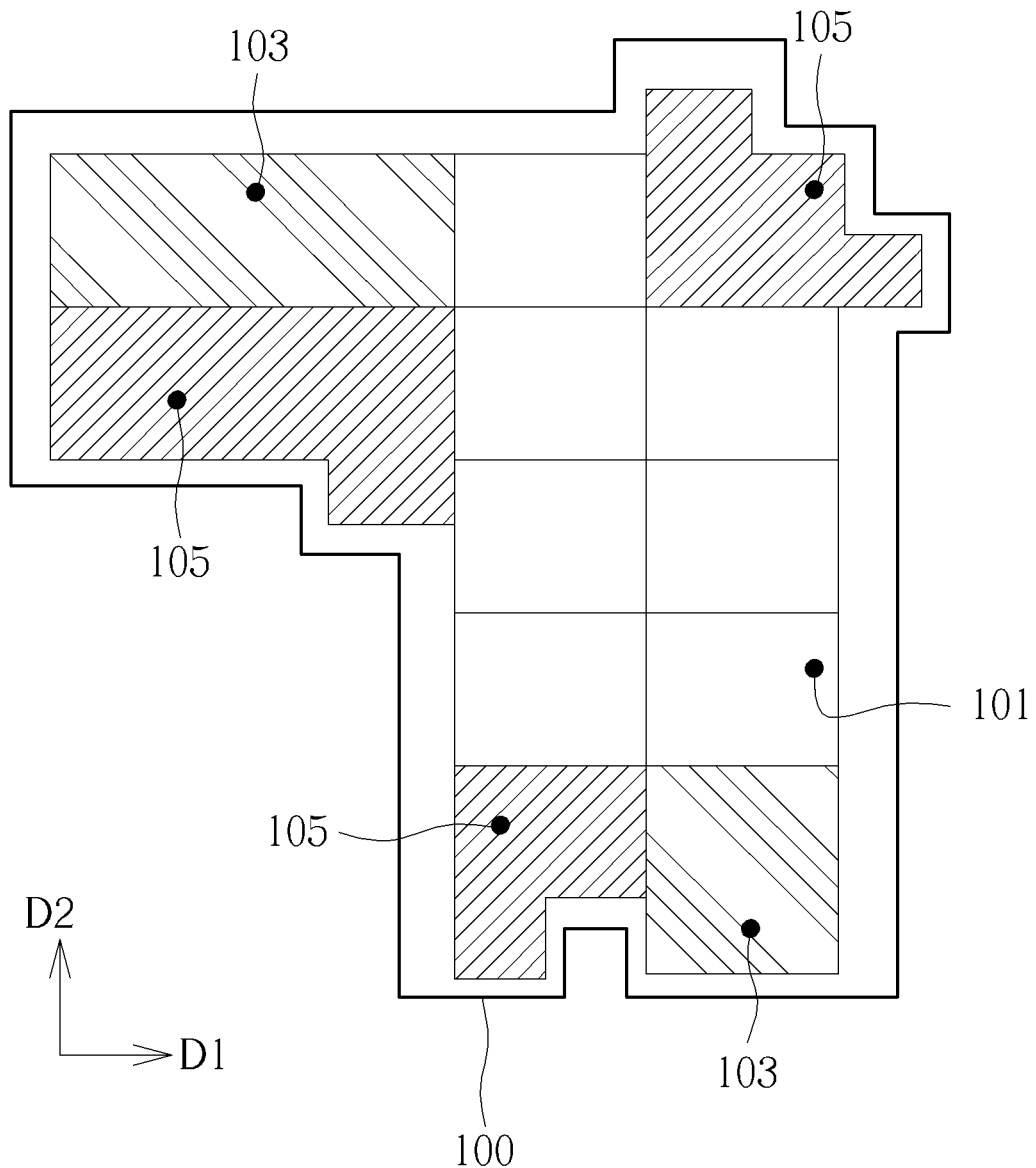
FIG. 1 is a schematic plan view of a dummy region with defined unit dummy cells, standard extended dummy cells and flexible extended dummy cells in accordance with one embodiment of the present invention.

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the following discussion it should be understood that formation of the dummy layer and/or dummy patterns filled on a substrate refers to the patterns on the processing reticle as well as the features transferred from the reticle to the semiconductor substrate which subsequently receives the patterns. Those dummy patterns may be sub-resolution features for optical proximity correction (OPC) to enhance the pattern density and pattern uniformity, or the supporting features to enhance the CMP performance. Those dummy patterns may be placed and defined by a computer system with storage units, processing units, pattern modification sections, pattern placement sections, and an OPC execution section, etc.

Moreover, it should be understood that a drawn layer is drawn by a circuit designer. Alternatively, an extracted layer is generally formed at pattern generation as a function of the drawn layer and may not be an electrically functional part of the circuit. The relevant components in OPC technique for arranging the dummy pattern, for example data input/output, image memory or the processing unit, will not be described in the embodiment. Similarly, the relevant tools, process or the material in the semiconductor manufacture will not be described in the embodiment too. Both these two contents are not essential and distinctive features and approaches to the dummy pattern arrangement in the present invention.

Hereinafter, a method of arranging dummy cells in a semiconductor device according to one embodiment of the present invention will be described with reference to FIGS. 1-9. In FIGS. 1-9, some components are enlarged, reduced in size, or omitted for easy understanding and preventing obscuring the subject matters of the present invention.

First, please refer to FIG. 1, which is a schematic plan view of a dummy region with defined unit dummy cells, standard extended dummy cells and flexible extended dummy cells in accordance with one embodiment of the present invention. A dummy region 100 for placing/filling the dummy cell is first defined on a substrate. The dummy region 100 may be defined based on adjacent circuit regions (not shown). For example, the substrate may first be included and set with multiple circuit regions for semiconductor devices. The remaining region on the substrate may all be defined as the dummy region 101 in order to increase the pattern density and improve the pattern uniformity. The embodiment exemplifies the dummy region 101 with an irregular shape filling up the blank surface on the substrate. This may help to explain the filling scheme and the advantage of the present invention.

In prior art, it is difficult to fill up all of the irregular dummy region with only standard dummy cells and extended dummy cells since the standard dummy cell has single and rigid dimension and the extended dummy cell is strictly confined by design rules, such as topological layout rule (TLR). Large empty spaces will remain in the dummy region after dummy filling if no standard dummy cell or extended dummy cell can fit into these remaining spaces. This situation is even worse when the dummy region is too irregular to fill up.

To improve the current dummy filling scheme and solve the above-mentioned issue, the concept of flexible extended dummy cell is provided in the present invention. In the arranging method of present invention, as shown in FIG. 1, a plurality of unit dummy cells 101 are first defined in the dummy region 100. The unit dummy cells 10 are arranged in rows and columns based on the space in the dummy region 100 and serve as a base for the other kinds of dummy cells to extend therefrom. After the unit dummy cells 101 are filled in and defined, the remaining dummy region 100 is filled up with standard extended dummy cells 103 and flexible extended dummy cells 105. The standard extended dummy cells 103 and the flexible extended dummy cells 105 are defined in a manner of extending from the original unit dummy cells 101 in a row direction D1 and/or a column direction D2. It is evident in FIG. 1 that the standard extended dummy cell 103 is rectangular in shape similar to the unit dummy cell 101, but with relatively larger area, while the flexible extended dummy cell 105 is irregular in shape and is dedicated to fill up the irregular remaining dummy region. Basically, the dummy region 101 will be filled with unit dummy cells 101 first until no more unit dummy cells 101 can be fit in or until the remaining dummy region can be fill with exactly one standard extended dummy cell 103 or exactly one flexible extended dummy cells 105 in each row and each column.

In the present invention, the unit dummy cell 101, standard extended dummy cell 103 and flexible extended dummy cell 105 defined in the dummy region 100 are configured to have different layouts. The various dummy cells would consist of different units and are confined by layout rules to different extents. The detailed layouts and structures of the unit dummy cell 101, standard extended dummy cell 103 and flexible extended dummy cell 105 will be explicitly explained in following embodiments.

In the dummy filling scheme of the present invention, the dummy cell may be configured and considered as extending either in row direction D1 or in column direction D2, depending on the position of the remaining dummy region and the direction to which the dummy cell to extend. The two extending type in the dummy cell will have different layouts and base/fixed dummy units.

Figure 2A:
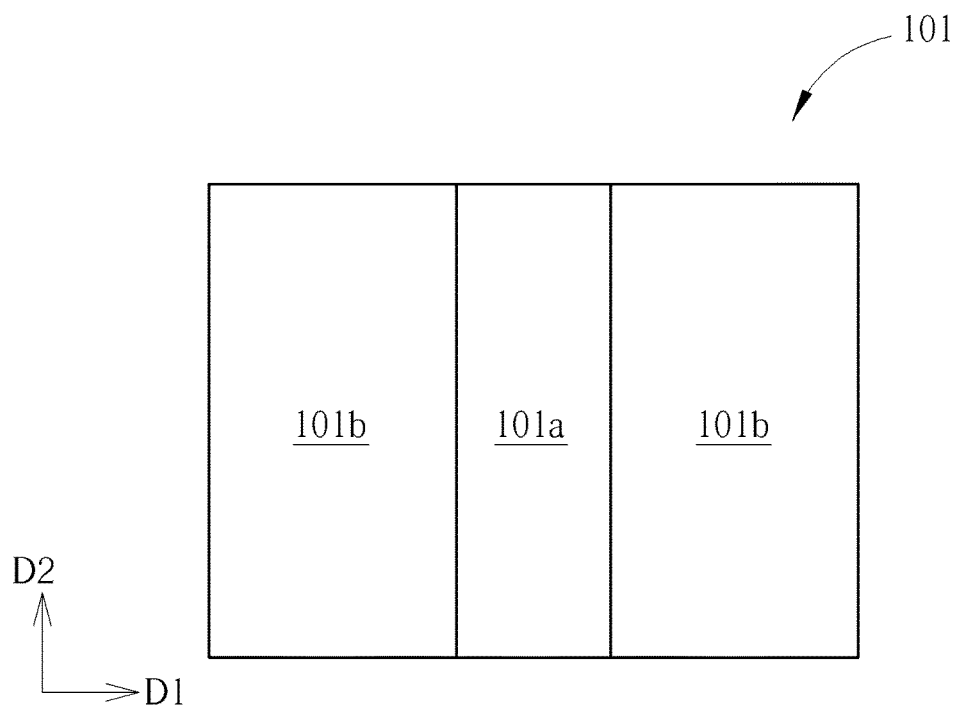
FIG. 2A and FIG. 2B are a schematic plan view and layout of a unit dummy cell in a first extending direction in accordance with one embodiment of the present invention.
Figure 2B:
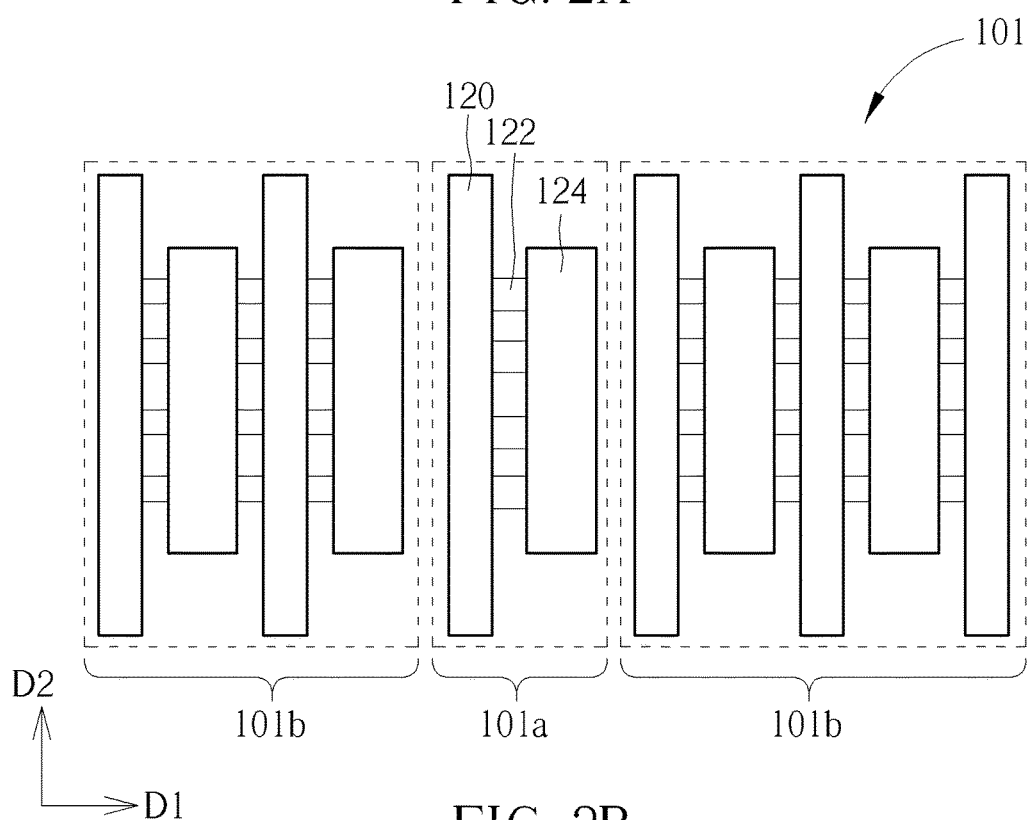

Please refer to FIGS. 2A and 2B, which are a schematic plan view and layout of the unit dummy cell 101 extending in row direction D1 in accordance with one embodiment of the present invention. As shown in FIG. 2A, each unit dummy cell 101 in row extension type may be considered as consisting of exactly one base dummy unit 101a and exactly two fixed dummy units 101b respectively at two opposite sides of the base dummy unit 101a in row direction D1. In the present invention, the base dummy unit 101a is a dummy unit having a minimum pitch in the row direction D1 or in the column direction D2, while the fixed dummy unit 101b is a dummy unit bound to be placed at edges of the dummy cell in either the row or column direction. For example, please refer to FIG. 2B, the base dummy unit 101a consists of one gate 120 traversing four fins 122 and one contact 124 on the fins. In this case, the minimum pitch in row direction D1 is the width of one gate 120 and one contact 124. The fixed dummy units 101b at edges of the dummy cell would consist of the components of at least one base dummy unit 101a. That is, the fixed dummy unit 101b has relatively larger dimension than the based dummy unit 101a. For example, the fixed dummy unit 101b in this embodiment consists of two or three gates 120 and two contacts 124 traversing four fins 122.

Figure 3A:
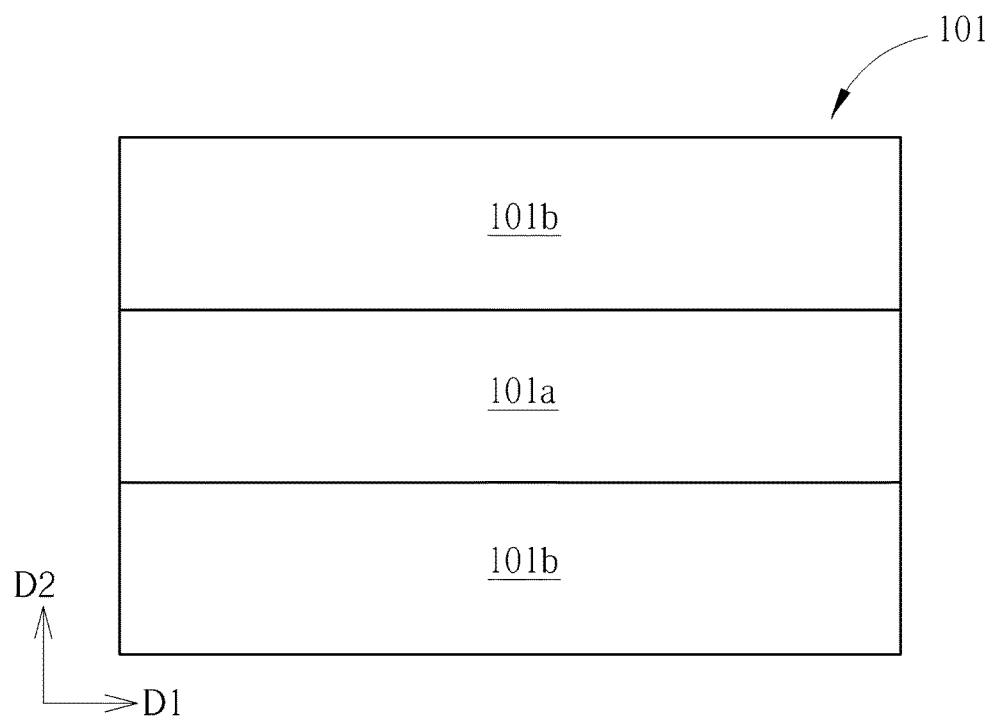
FIG. 3A and FIG. 3B are a schematic plan view and layout of a unit dummy cell in a second extending direction in accordance with one embodiment of the present invention.
Figure 3B:
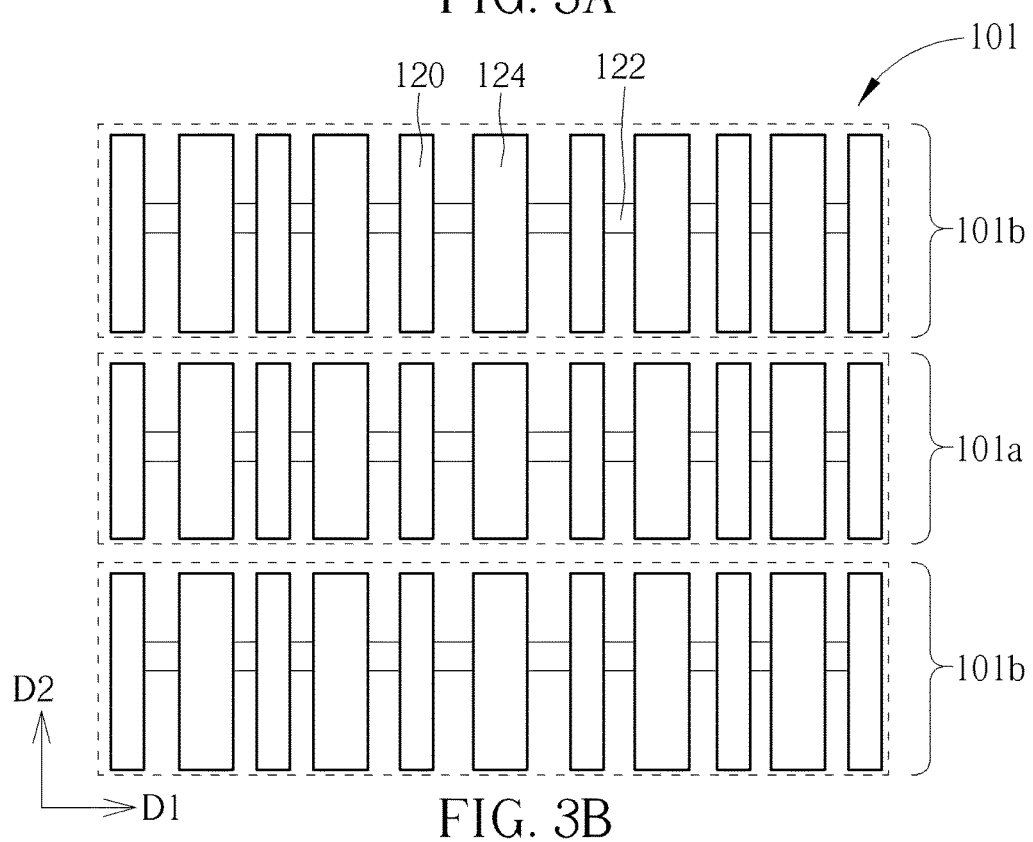

On the other hand, the unit dummy cell 101 may be considered as extending in the column direction D2. Please refer to FIGS. 3A and 3B, which are a schematic plan view and layout of the unit dummy cell 101 extending in the column direction D2 in accordance with one embodiment of the present invention. As shown in FIG. 3A, each unit dummy cell 101 in column extension type may be considered as consisting of exactly one base dummy unit 101a and exactly two fixed dummy units 101b respectively at two opposite sides of the base dummy unit 101a in column direction D2. In this embodiment, as shown in FIG. 3B, the minimum pitch in the column direction D2 should encompass a coverage section of at least one fin 122. The base dummy units 101b consist of six gates 120 and five contacts 124 traversing only one fin 122, and the fixed dummy units 101b at both sides of the base dummy units 101b in column direction D2 are basically the same as the base dummy unit 101a.

As it is explained in the two embodiments above, the principle of defining a base dummy unit 101a is that it should consist of components in one minimum pitch either in the row direction or in the column direction, while the fixed dummy unit 101b should consist of the components of at least one base dummy unit 101a either in row extension type or in column extension type.

Figure 4:
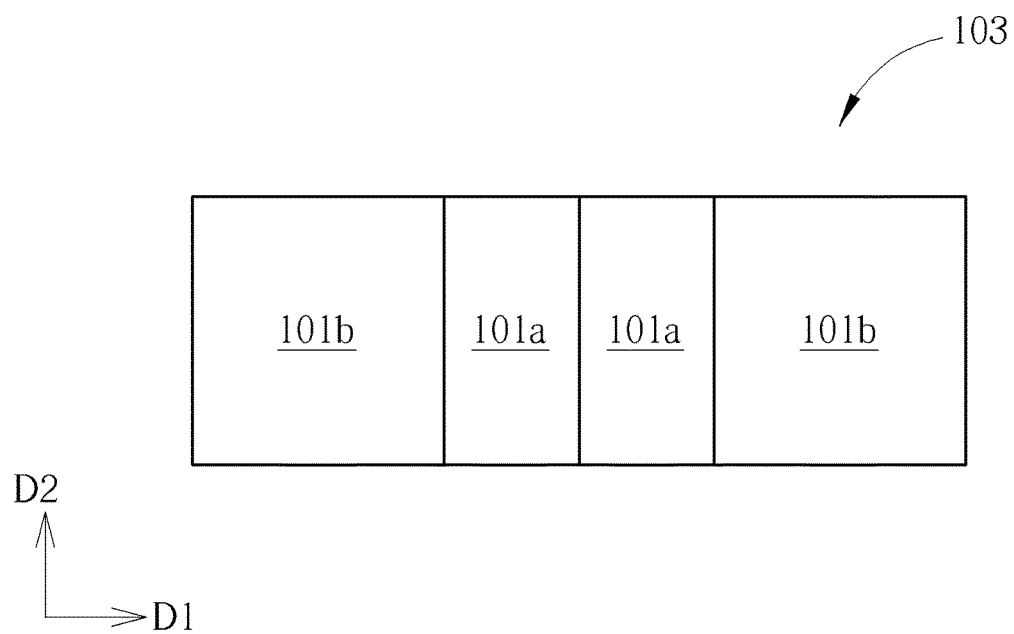
FIG. 4 is a schematic plan view of a standard extended dummy cell in a first extending direction in accordance with one embodiment of the present invention.
Figure 5:
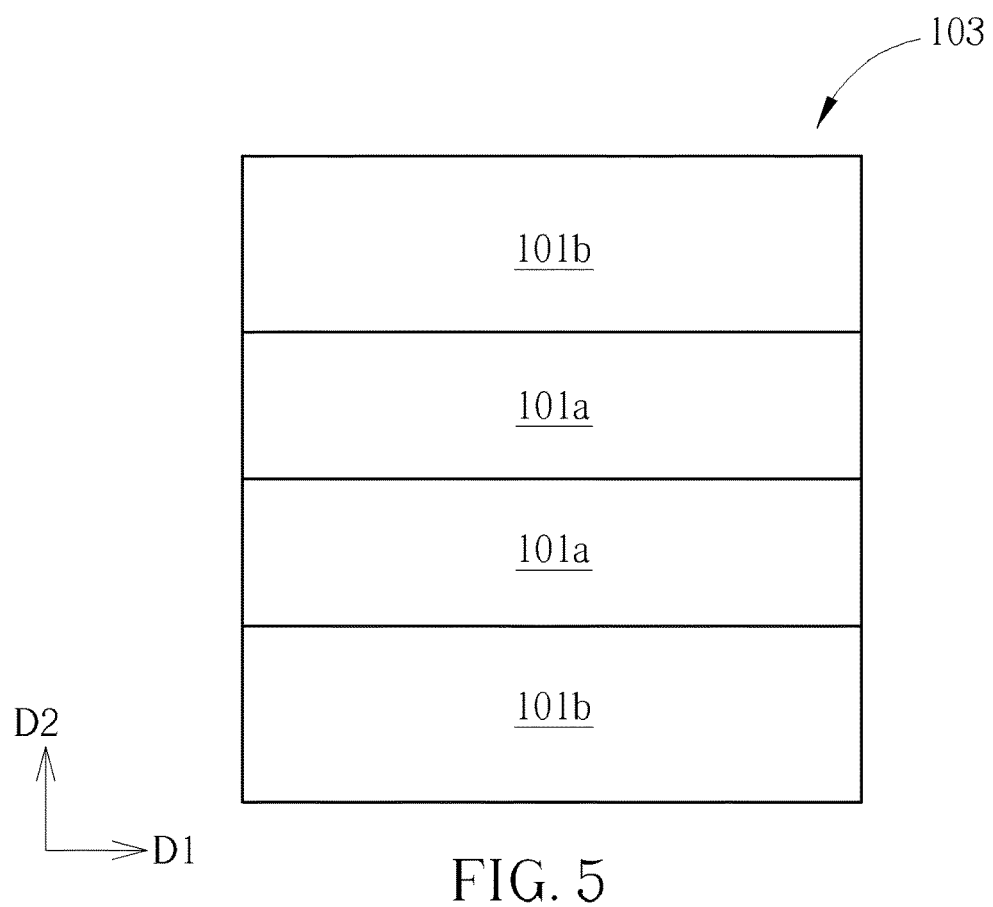
FIG. 5 is a schematic plan view of a standard extended dummy cell in a second extending direction in accordance with one embodiment of the present invention.

Please refer to FIG. 4 and FIG. 5, which are schematic plan views of a standard extended dummy cell extending in row direction D1 and in column direction D2, respectively, in accordance with one embodiment of the present invention. The shapes of these two standard extended dummy cells 103 in FIG. 4 and FIG. 5 may correspond respectively to the two standard extended dummy cells 103 shown in FIG. 1. In the present invention, no matter being configured as in row extension type or in column extension type, the primary difference between the unit dummy cell 101 and the standard extended dummy cell 103 is that the standard extended dummy cell 103 should consist of at least two base dummy units 101a between two fixed dummy units 101b. That is, the standard extended dummy cell 103 would be a relatively larger and extended version of the unit dummy cell 101 in row direction D1 or column direction D2. In this configuration, the standard extended dummy cell is dedicated to fill in the remaining dummy region that is slightly larger than the area of the unit dummy cell 101, so that more dummy region may be covered by dummy patterns. The number of the base dummy unit 101a in the standard extended dummy cell 103 may be varied according to required extending range.

Figure 6:
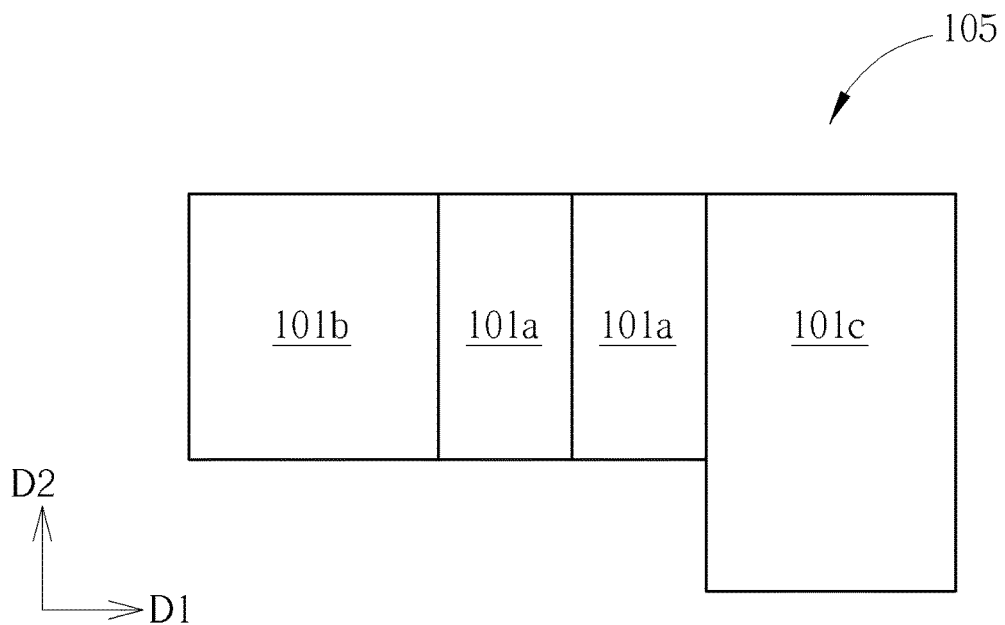
FIG. 6 is a schematic plan view of a flexible extended dummy cell in a first extending direction in accordance with one embodiment of the present invention.
Figure 7:
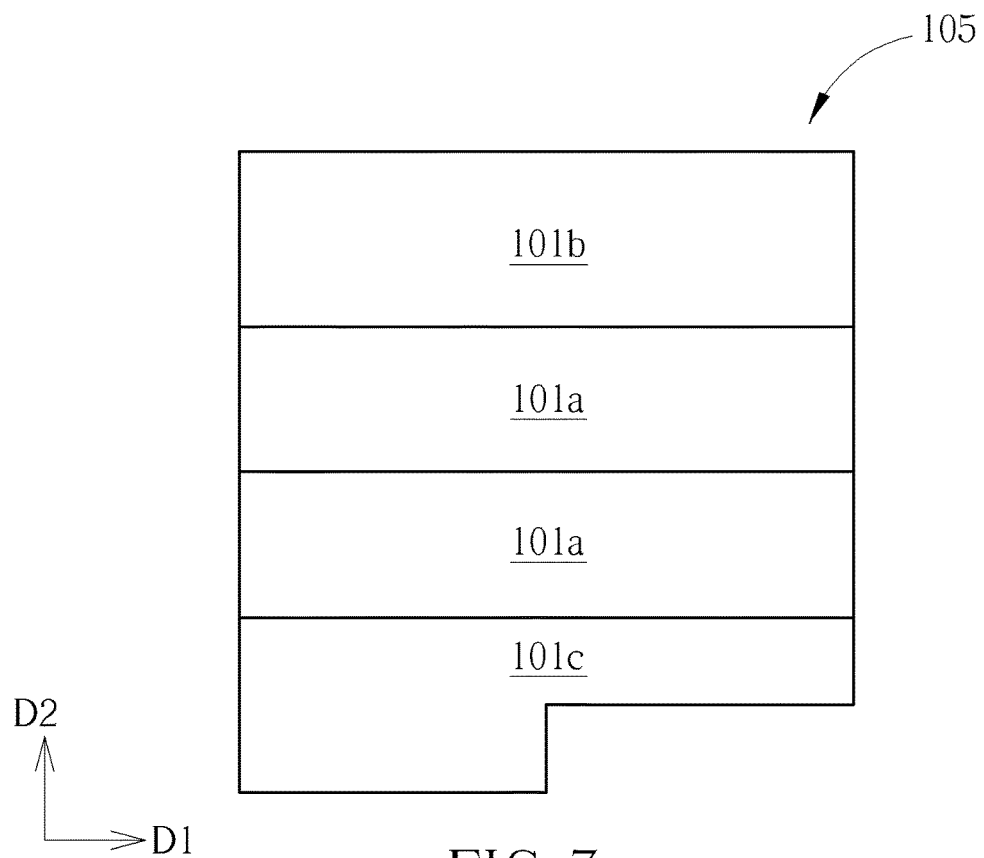
FIG. 7 is a schematic plan view of a flexible extended dummy cell in a second extending direction in accordance with one embodiment of the present invention.

Although the dummy region 100 is filled with unit dummy cells 101 and standard extended dummy cells 103, there are still lots of empty areas remaining in the dummy region 100, especially the area with irregular profile. To further improve the pattern uniformity, a novel flexible extended unit is provided in the present invention. The flexible dummy unit features the ability of flexible dummy filling without being confined by the layout rules. Please refer to FIG. 6 and FIG. 7, which are schematic plan views of a flexible extended dummy cell extending in the row direction D1 and in the column direction D2, respectively, in accordance with one embodiment of the present invention. The shapes of these two flexible extended dummy cells 103 in FIG. 6 and FIG. 7 may correspond respectively to the two flexible extended dummy cells 103 shown in FIG. 1. Similar to the standard extended dummy cell 103, the flexible extended dummy cells 103 should consist of at least two base dummy units 101a in the center, but the dummy units placed at two opposite sides of the base dummy units 101a are not necessary to be the fixed dummy unit 101b. In order to accommodate the irregular dummy profile and to provide more flexibility of dummy filling, the fixed dummy unit 101b once bound to be placed at two opposite sides of the base dummy units 101a may be replaced, either one or both, with flexible cells 101c. As it is shown in FIG. 6 and FIG. 7, the flexible cell 101c is not confined by layout rules and may, in whole or in part, extend over or retract inwardly from its default boundary as compared to the fixed dummy units 101b in the row direction D1 or the column direction D2. In this configuration, the shape of the flexible cell 101c may be modified in both of the row direction D1 or the column direction D2 to accommodate the shape of the irregular dummy region to be filled with, so that more dummy region may be covered by dummy patterns. The number of the base dummy units 101a in the flexible extended dummy cell 105 may be varied according to required extending range likes the one in standard extended dummy cell 103.

Figure 8:
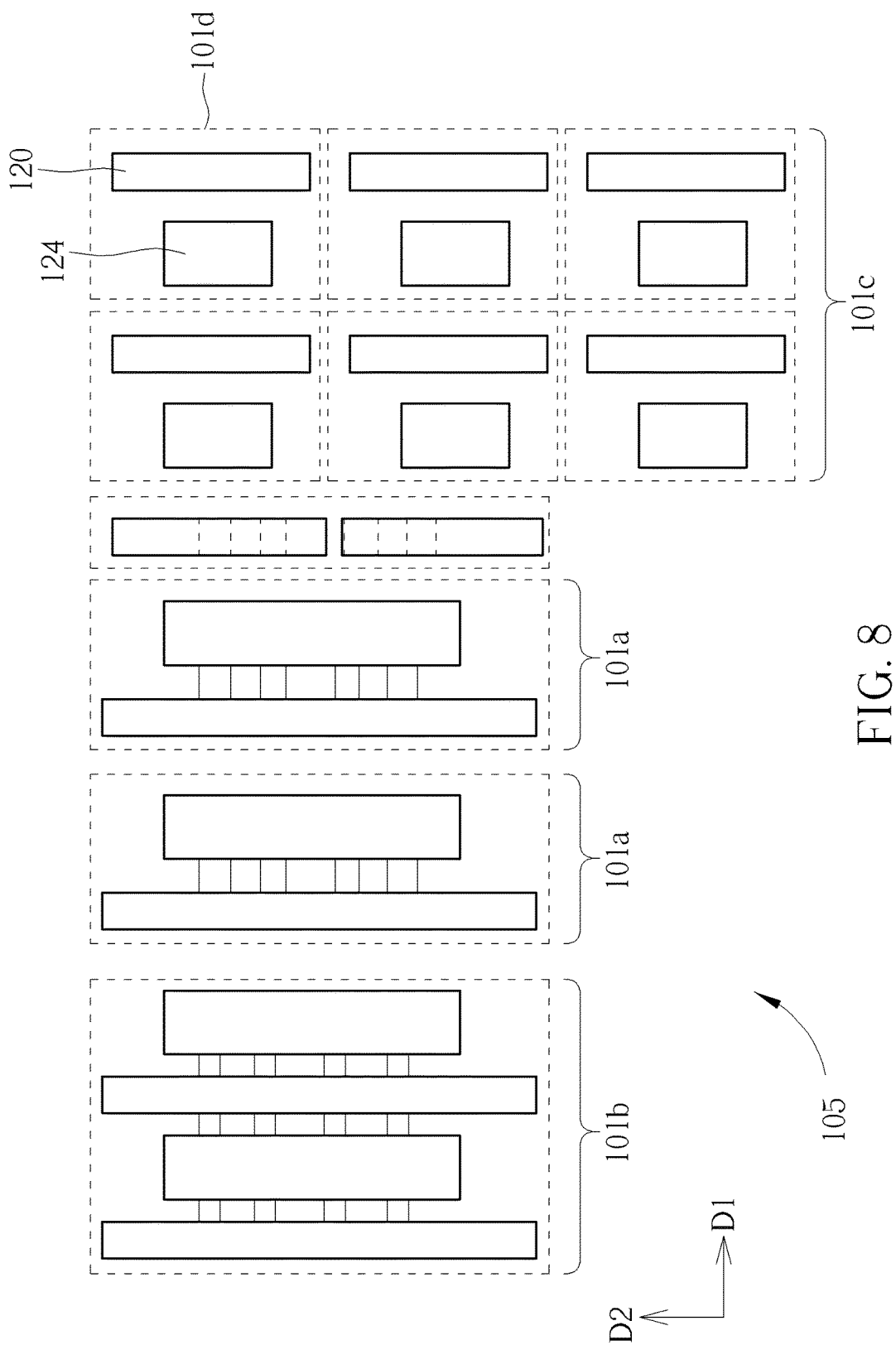
FIG. 8 is a schematic layout of the flexible extended dummy cell shown in FIG. 6 in accordance with one embodiment of the present invention.

The reason why the shape of the flexible cell 101c in the present invention can be modified and accommodated to irregular shape is because the flexible cell 101c is substantially composed of a plurality of smaller flexible dummy units. Please refer to FIG. 8, which is a schematic layout of the flexible extended dummy cell 105 shown in FIG. 6 in accordance with one embodiment of the present invention. As it is shown in FIG. 8, the flexible extended dummy cell 105 consists of two base dummy units 101a, one fixed dummy unit 101b at one side of the two base dummy units 101a and one flexible cell 101c at the other side. In the embodiment, the flexible cell 101c is composed of six flexible dummy units 101d arranged in rows and columns to shape the flexible cell 101c. It should be noted that the dimension of each flexible dummy units 101d is smaller than the one of the base dummy unit 101a and the fixed dummy unit 101b in the column direction D2. This is because each flexible dummy unit 101d consists of only one gate 120 and one contact 104 and most importantly, without any fin 122. As it is explained in previous paragraphs, the rule of minimum pitch in the column direction D2 is that it should encompass a coverage section of at least one fin 122. Without the limitation of fins, the flexible dummy unit 101d may be smaller than the base dummy unit 101a. In this embodiment, the flexible dummy unit 101d is half of the base dummy unit 101a. Furthermore, it should be noted that the flexible dummy units 101d may be selectively added in or removed from regular dummy cells to shape the flexible cell 101c like the ones in FIG. 6 and FIG. 7 with extended portions and retracted portions over or from the cell boundary and form the irregular flexible extended dummy cell 105. In addition, the flexible dummy unit 101d is limited by the layout rule likes the fixed dummy unit 101c, that only one fixed dummy unit 101c can be placed at each sides of the base dummy unit 101a.

Figure 9:
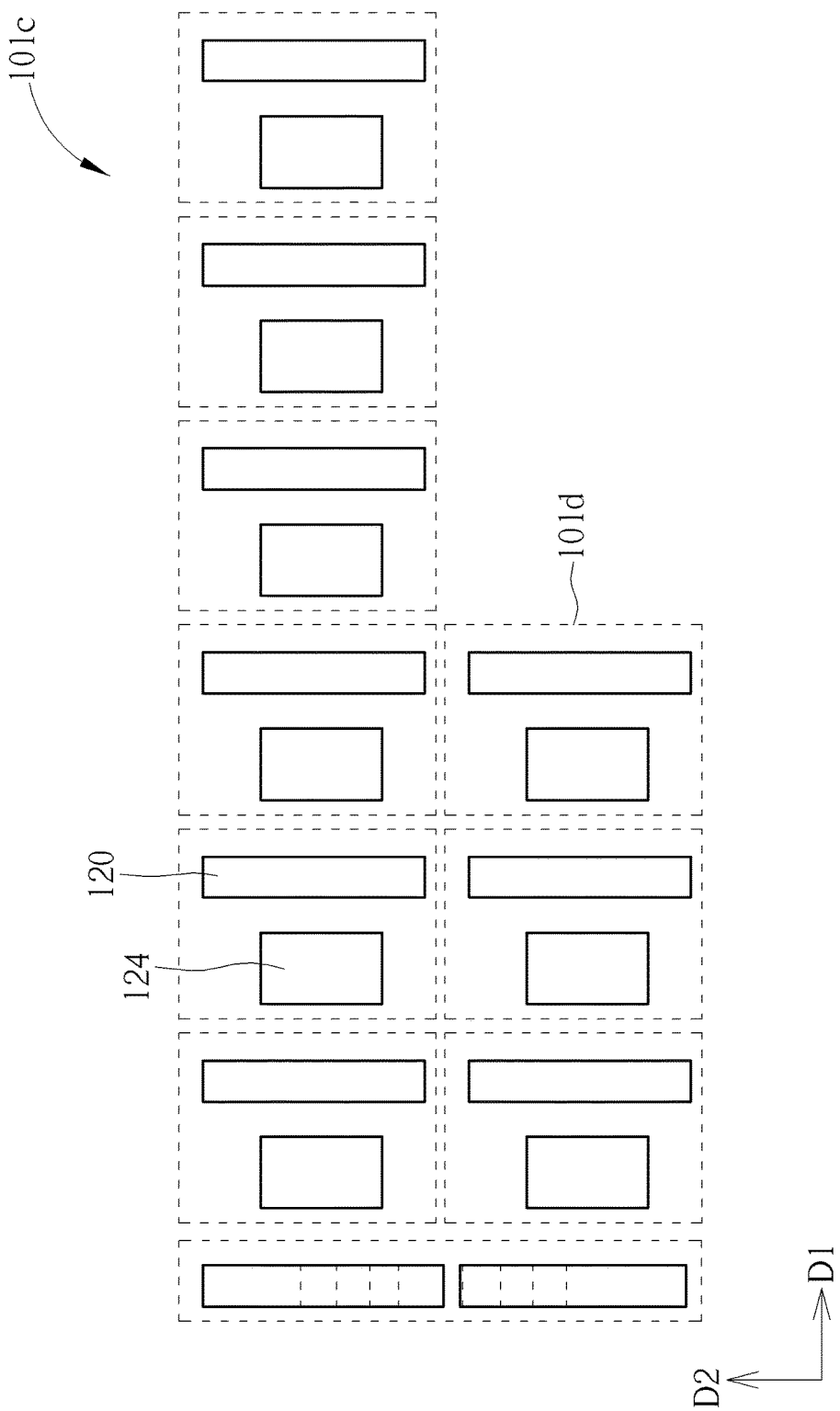
FIG. 9 is a schematic layout of the flexible extended dummy cell shown in FIG. 7 in accordance with one embodiment of the present invention.

Please refer to FIG. 9, which is a schematic layout of the flexible cell 101c shown in FIG. 7 in accordance with one embodiment of the present invention. As it is shown in FIG. 9, the flexible cell 101c in irregular shape may be composed by a plurality of flexible dummy units 101d arranged in rows and column. This embodiment shows that fixed dummy unit 101c may be arranged into any shape in rows and columns to provide a flexible extended dummy cell 105 for any irregular dummy region 100.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dummy cell arrangement in a semiconductor device, comprising:
    a substrate with a dummy region;
    a plurality of unit dummy cells arranged in rows and columns in said dummy region, wherein each unit dummy cell comprises exactly one base dummy unit and exactly two fixed dummy units at two opposite sides of said exactly one base dummy unit in a row direction or in a column direction, and said base dummy unit comprises at least one fin, at least one gate traversing said at least one fin and at least one contact on said at least one fin;
    a plurality of standard extended dummy cells arranged at the end of said unit dummy cells in rows and columns, wherein each said standard extended unit dummy cell comprises at least two said base dummy units and exactly two fixed dummy units at two opposite sides of said at least two base dummy units in the row direction or in the column direction, said exactly two base dummy units are directly contacting one another, and said fixed dummy unit is larger than said base dummy unit; and
    a plurality of flexible extended dummy cells arranged at the end of said unit dummy cells in rows and columns and filling up remaining said dummy region, wherein each flexible extended dummy cell comprises at least two said base dummy units and a plurality of flexible dummy units arranged at two opposite sides of said at least two base dummy units in the row direction or in the column direction, and said flexible dummy unit comprises one said gate and one said contact, wherein said at least one gate in said base dummy unit and said gate in said flexible dummy units are a plurality gates, and each of said gates is a singular gate being vertically arranged.

2. The dummy cell arrangement in a semiconductor device according to claim 1, wherein said base dummy unit is a dummy unit having a minimum pitch in said row direction or said column direction.

3. The dummy cell arrangement in a semiconductor device according to claim 1, wherein said fixed dummy unit comprises at least one said fin, at least one said gate traversing said at least one fin and at least one said contact on said at least one fin, and said fixed dummy unit is larger than said base dummy unit.

4. A dummy cell arrangement in a semiconductor device, comprising:
    a substrate with a dummy region, wherein said dummy region is filled with a plurality of unit dummy cells, a plurality of standard extended dummy cells and a plurality of flexible extended dummy cells, each of said flexible extended dummy cells is disposed directly contacting one of said unit dummy cells or one of said standard extended dummy cells, each of said standard extended dummy cells is disposed directly contacting one of said unit dummy cells, wherein each of said unit dummy cells includes exactly one base dummy unit and exactly two fixed dummy units at two opposite sides of said exactly one base dummy unit in a row direction or in a column direction, and said base dummy unit includes one gate, at least one fin, and one contact, wherein said gate is perpendicularly arranged with respect to said at least one fin, and said contact is disposed on said at least one fin, and said fixed dummy unit includes said at least one fin, a plurality of said gates and a plurality of said contacts, wherein said gates are perpendicularly arranged with respect to said at least one fin, and said contacts are disposed on said at least one fin, and said fixed dummy unit is larger than said base dummy unit, and said each standard extended dummy cell includes at least two said base dummy units and at least two said fixed dummy units, and said each flexible extended dummy cell includes at least two said base dummy units, said fixed dummy unit and one flexible cell, wherein said flexible cell includes a plurality of flexible dummy units, and each flexible dummy unit includes one said gate and one said contact, wherein adjacent said flexible dummy units are in direct contact with each other; and at least one of said flexible dummy units is in direct contact with one of said at least two base dummy unit of said each flexible extended dummy cell.

* * * * *